United States Patent
Tao et al.

(10) Patent No.: US 6,838,762 B2
(45) Date of Patent: Jan. 4, 2005

(54) WATER-LEVEL PACKAGE WITH BUMP RING

(75) Inventors: Su Tao, Kaohsiung (TW); Kuo Chung Yee, Taipei (TW); Jen Chieh Kao, Kaohsiung (TW); Chih Lung Chen, Fengshan (TW); Hsing Jung Liau, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/412,291

(22) Filed: Apr. 14, 2003

(65) Prior Publication Data

US 2003/0214007 A1 Nov. 20, 2003

(30) Foreign Application Priority Data

May 17, 2002 (TW) ........................................ 91110826 A (51) Int. Cl.[7] .............................................. H01L 23/48
(52) U.S. Cl. ........................................ 257/690; 257/698
(58) Field of Search .............................. 257/690, 698, 257/737

(56) References Cited

U.S. PATENT DOCUMENTS

| | | | | |
|---|---|---|---|---|
| 3,591,839 A | * | 7/1971 | Evans | ........................ 257/684 |
| 4,802,952 A | * | 2/1989 | Kobori et al. | ................. 438/51 |
| 4,839,717 A | * | 6/1989 | Phy et al. | .................... 257/664 |
| 5,136,363 A | * | 8/1992 | Endo et al. | .................. 257/781 |
| 5,323,051 A | | 6/1994 | Adams et al. | |
| 5,760,470 A | * | 6/1998 | Stansbury | .................... 257/690 |
| 5,925,936 A | | 7/1999 | Yamaji | |
| 6,004,867 A | | 12/1999 | Kim et al. | |
| 6,297,072 B1 | * | 10/2001 | Tilmans et al. | .............. 438/106 |
| 2003/0183407 A1 | * | 10/2003 | Ma et al. | .................... 174/52.4 |

OTHER PUBLICATIONS

U.S. Appl. No. 09/928,694.

* cited by examiner

*Primary Examiner*—Allan R. Wilson (57) ABSTRACT

A wafer-level package includes a first chip, a second chip and a bump ring. The first chip has a semiconductor micro device, a bonding pad ring surrounding the semiconductor micro device, and a plurality of bonding pads disposed outside the bonding pad ring and electrically connected to the semiconductor micro device for electrically connecting to an external circuit. The second chip has a bonding pad ring corresponding to the bonding pad ring of the first chip. The bump ring is disposed between the bonding pad ring of the first chip and the bonding pad ring of the second chip for bonding the first and the second chips so as to form a hermetical cavity.

16 Claims, 8 Drawing Sheets

WAFER-LEVEL PACKAGE WITH BUMP RING

BACKGROUND OF THE INVENTION

1. Field of the Invention

The present invention generally relates to a method for manufacturing a wafer-level semiconductor package, and more particularly to a method for manufacturing a semiconductor micro device package with a hermetical cavity.

2. Description of the Related Art

As electronic devices have become more smaller and thinner, the velocity and the complexity of IC chip become more and more higher. Accordingly, a need has arisen for higher package efficiency. Demand for miniaturization is the primary catalyst driving the usage of advanced packages such as chip scale packages (CSP) and flip chips. Both of them greatly increase the packaging efficiency and significantly reduce the amount of board real estate required when compared to the alternative ball grid array (BGA) and thin small outline package (TSOP). However, as compared with conventional BGA or TSOP, CSP has the disadvantage of higher manufacturing cost. However, this problem could be eliminated if the chip-sized packages could be mass produced more easily. Therefore, the semiconductor packaging industry has tried to develop mass production techniques at the wafer-level for manufacturing the chip-sized packages, as illustrated in U.S. Pat. No. 5,323,051, U.S. Pat. No. 5,925,936 and U.S. Pat. No. 6,004,867. These wafer-level package techniques can not only increase the throughput but also reduce the contamination on the wafer surface since its package process can proceed before the wafer-dicing process. Therefore, a flip chip wafer-level package technique is applied to a semiconductor micro device package recently.

Figure 1A:
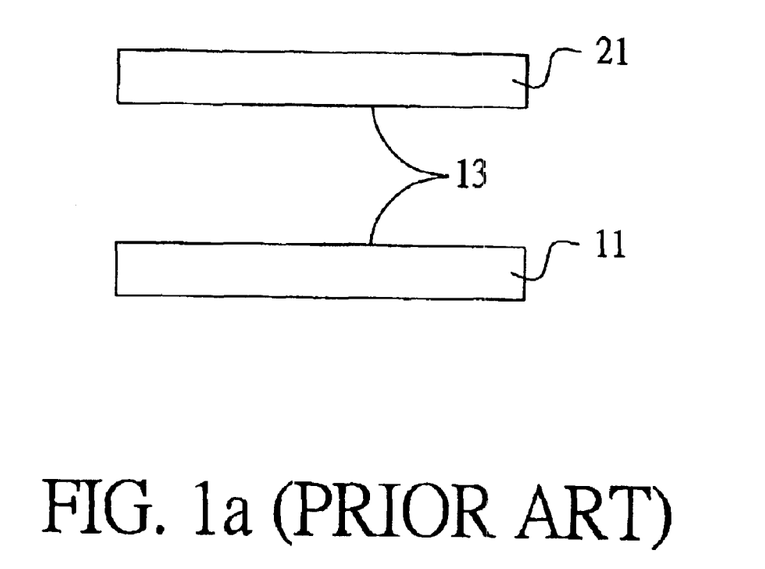
FIGS. 1a and 1b are schematic views for illustrating a conventional silicon fusion method.
Figure 1B:
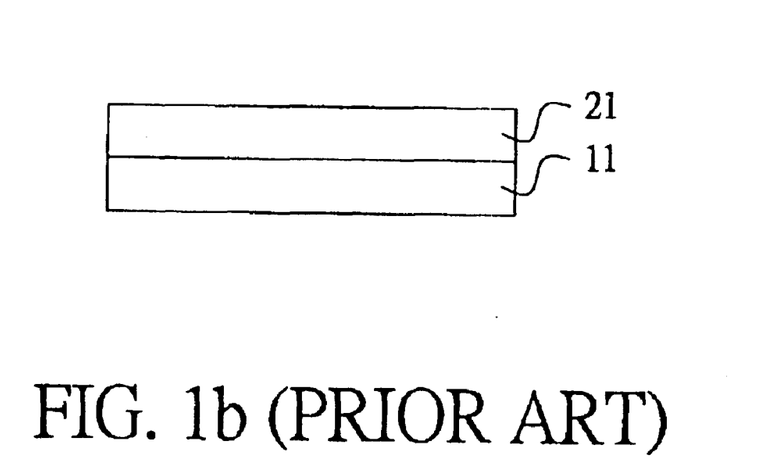

In conventional wafer-level package techniques, there are three main types of wafer-to-wafer bonding methods which include the silicon fusion method, the anodic bonding method, and the intermediate-layered bonding method. FIGS. 1a–1b are schematic views of the silicon fusion method for bonding two wafers formed of silicon, wherein FIG. 1a depicts that a lower wafer 11 and an upper wafer 21 are closely faced with their respective hydrophilic surfaces opposite to each other and the hydrophilic surfaces must be relatively even and clean with the roughness below 10A and the curvature smaller than 5 mm so as to ensure the surface quality of the wafer bonding, and FIG. 1b depicts that the opposite surfaces of the lower wafer 11 and the upper wafer 21 are brought together and pressed with a force concentrated in the center of the wafers such that the lower wafer 11 and the upper wafer 21 initiate a contact and bond to each other by the attraction (formed as hydrogen bonding) between the hydrophilic surfaces, and the center contact produces a bonding wave over the whole wafer surfaces so as to tighten the contact of the wafer surfaces. The wafers, then, are heated at a temperature in the range 300 to 800° C. so as to dehydrate the hydrophilic surfaces to form a bonding as strong as a silicon crystal structure. There are generally two drawbacks in the silicon fusion bonding method. Firstly, since the silicon fusion bonding is processed in a high temperature and the general wafers having integrated circuits, passive components (i.e., resistors, capacitors, and the like) or MEMs (micro-electro mechanical system) active components are not high temperature-resistant, the bonding method is not applicable for those wafers having semiconductor devices. Secondly, since this bonding method strictly requires a highly clean and flat bonding surface, it not only increases the manufacturing cost, but also not applicable for packaging wafers having semiconductor micro devices.

Figure 2:
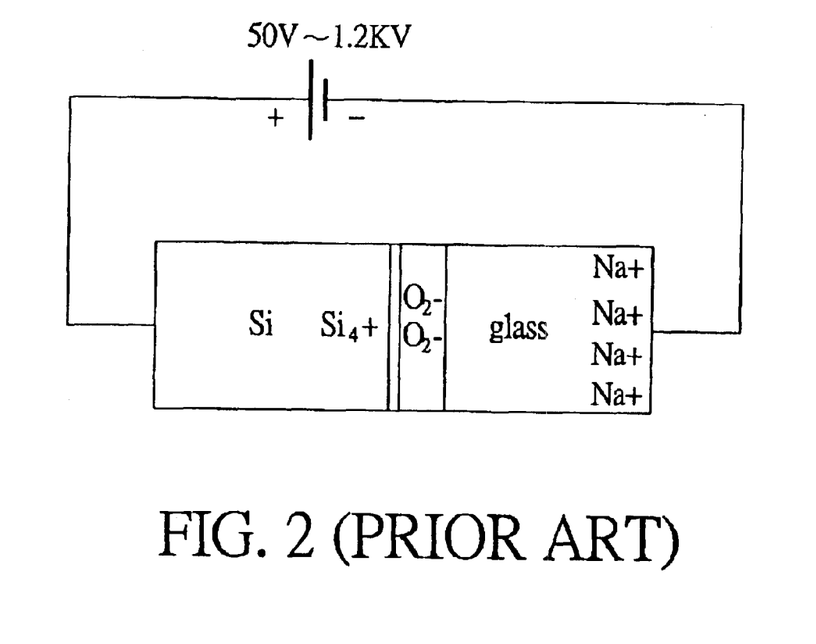
FIG. 2 is a schematic view for illustrating a conventional anodic bonding method.

FIG. 2 is a schematic view of a conventional anodic bonding method which is generally applied in bonding a silicon wafer and a glass substrate. The anode is connected with the silicon wafer, the cathode is connected to the glass substrate and a voltage ranging from 50 V to 1200 V is applied such that the silicon wafer and the glass substrate become ionized and generate ion migration so as to build up an intense electric field for approaching and bonding, with the bonding temperature around 1000° C., the silicon wafer and the glass substrate. However, the anodic method has following drawbacks. Since the anodic method needs to proceed in a high bonding temperature, the anodic method is also not applicable for bonding a wafer having semiconductor micro devices and a glass substrate. Furthermore, it also has the thermal mismatch problem.

Figure 3:
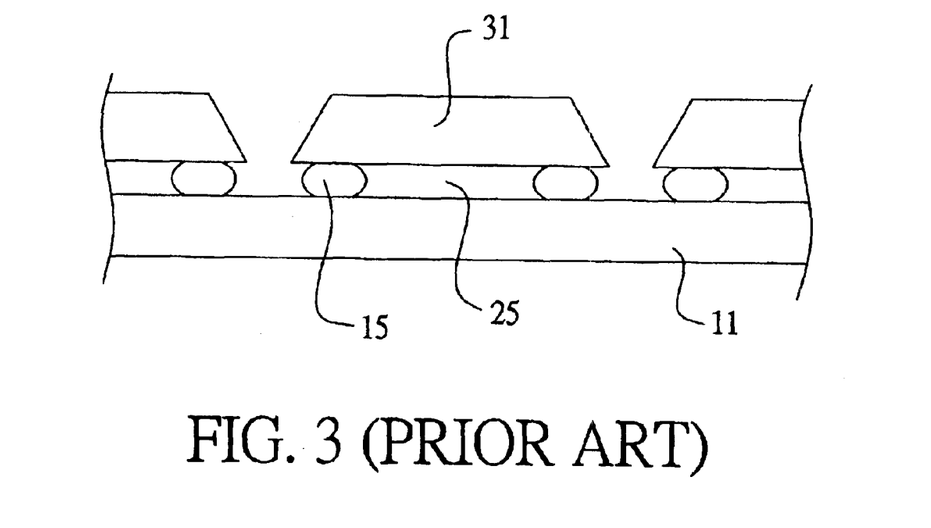
FIG. 3 is a schematic view for illustrating a conventional intermediate-layered bonding method.

FIG. 3 is a schematic view of a conventional intermediate-layered bonding method. It can be seen that an upper wafer (or chip) 31 is bonded to a lower wafer 11 by an intermediated layer 15 to form a plurality of hermetical cavity 25. The intermediated layer 15, typically utilizing polyimide, epoxy, or anisotropic conductive adhesive film (ACF) as its material, is pre-disposed on the peripheral portion of each chip of the lower wafer 11 by printing or photolithography techniques, and then the upper wafer 31 and the lower wafer 11 are bonded together by thermo-compression. The advantage of the intermediate-layered bonding method is that the bonding process proceeds in low temperature below 150° C. The drawbacks of the intermediate-layered bonding method are as follows. First, since the intermediated layer 15 is generally consisted of an organic material, the hermetical cavity 25 is not fully sealed, and moisture can easily permeate into the hermetical cavity 25, which is not applicable for those packages having semiconductor micro devices and requiring hermetic reliability. Secondly, the material, such as epoxy, tends to have outgasing problem, which disadvantageously affects the hermetic and vacuum reliability of the hermetical cavity 25.

Therefore, it is needed to provide a method of manufacturing a wafer-level semiconductor micro device package so as to solve the above-mentioned problems in the prior art.

SUMMARY OF THE INVENTION

It is an object of the present invention to provide a wafer-level package with bump, in which a semiconductor micro device package with a hermetical cavity can be completed.

It is another object of the present invention to provide a method of manufacturing a wafer-level package with a hermetical cavity, in which wafers can be bonded in a lower temperature so as to ensure the reliability of semiconductor micro devices.

In order to achieve the objects mentioned hereinabove, the present invention provides a wafer-level package with bump, which comprises a first chip, a second chip, and a bump ring. The first chip has a semiconductor micro device, a bonding pad ring surrounding the semiconductor micro device, and a plurality of bonding pads disposed outside the bonding pad ring and electrically connected to the semiconductor micro device for electrically connecting to an external circuit. The second chip has a bonding pad ring corresponding to the bonding pad ring of the first chip. The bump ring is disposed between the bonding pad ring of the first chip and the bonding pad ring of the second chip for bonding the first and the second chips so as to form a hermetical cavity.

The present invention further provides a method for manufacturing a wafer-level package with a hermetical cavity, which comprises the following steps: (a) providing a first substrate comprising a plurality of first chips wherein each first chip is spaced to one another by scribe lines and is provided with a bonding pad ring thereon and a plurality of bonding pads disposed outside the bonding pad ring; (b) forming an under bump metallurgy (UBM) on the bonding pad ring of the first substrate; (c) forming a bump ring on the bonding pad ring of each chip; (d) providing a second substrate having scribe lines corresponding to the scribe lines of the first substrate and a plurality of bonding pad rings mirroredly corresponding to the bonding pad rings of the first substrate; (e) forming a UBM on each bonding pad ring of the second substrate; (f) aligning the first substrate with the second substrate and then bonding them together such that the plurality of bump rings of the first substrate are respectively and correspondingly connected to the plurality of the bonding pad rings of the second substrate, and forming a plurality of hermetical cavities between the first substrate and the second substrate; (g) cutting the first substrate and the second substrate along the scribe lines of the first substrate and the second substrate respectively so as to form packages individually.

According to the wafer-level package with bump of the present invention, two wafers can be bonded by bump in vacuum with a temperature below 150° C., namely cold welding process, so as to be applicable for a packaging process having various type of semiconductor micro devices. The metal (gold or solder) with hardness, instead of the conventional outgasing material (i.e. epoxy), can be used as an intermediated layer between these two wafers for forming a hermetical cavity between these two wafers so as to ensure the reliability of the semiconductor micro device.

BRIEF DESCRIPTION OF THE DRAWINGS

Other objects, advantages, and novel features of the invention will become more apparent from the following detailed description when taken in conjunction with the accompanying drawings.

DESCRIPTION OF THE PREFERRED EMBODIMENT

Figure 4:
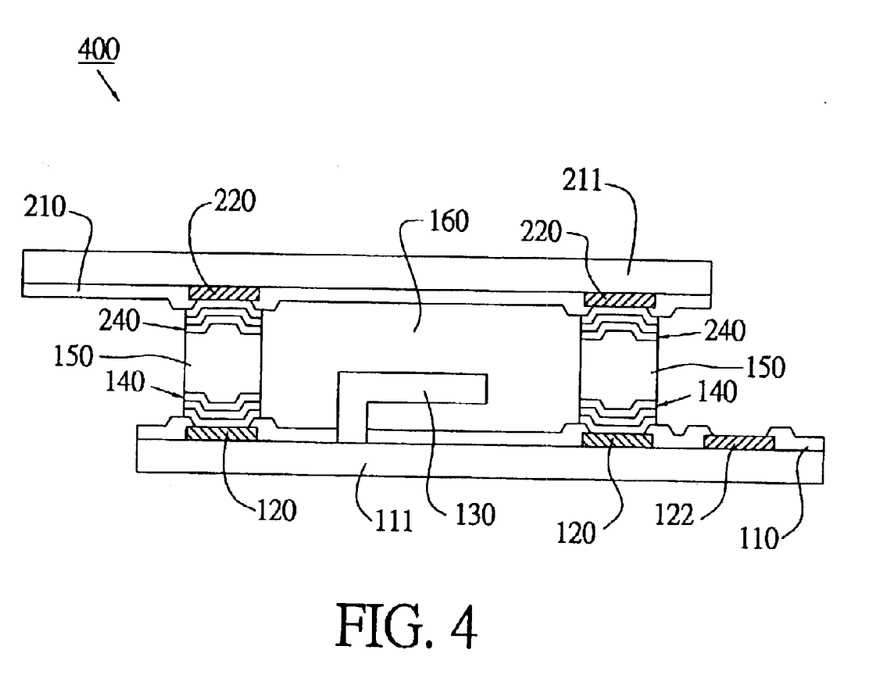
FIG. 4 is a schematically cross-sectional view of a wafer-level package with bump according to an embodiment of the present invention.

As shown in FIG. 4, it is a cross-sectional view of a package 400 with bump according to an embodiment of the present invention. The package 400 comprises a base chip 111, a gold bump ring 150, and a cover chip 211. The base chip 111 has a semiconductor micro device 130 electrically connected to a plurality of bonding pads 122, and a passivation layer 110 covers the top edge of a bonding pad ring 120 and the top edge of the bonding pad 122 with the center portions of the bonding pad ring 120 and the bonding pad 122 exposed. An under bump metallurgy (UBM) 140 is disposed on the bonding pad ring 120 at a portion exposed from the passivation layer 110. The UBM 140 comprises an adhesion layer, a barrier layer, and a wetting layer.

A gold bump ring 150 is formed on the bonding pad ring 120 and adjacent to the UBM 140 for connecting the base chip 111 and the cover chip 211 so as to form a hermetical cavity 160 to enclose the semiconductor micro device 130. The cover chip 211 has a bonding pad ring 220 thereon corresponding to the bonding pad ring 120 of the base chip 111. The cover chip 211 also provides a passivation layer 210 and a UBM 240, and the UBM 240 is employed for improving the electrical and mechanical connection between the gold bump ring 150 and the bonding pad ring 220 of the cover chip 211.

The base chip 111 further comprise a plurality of bonding pads 122 disposed outside the bonding pad ring 120 for electrically connecting to the semiconductor micro device 130. Those skilled in the art will appreciate that the bonding pads 122 can be electrically connected to an external substrate or a printed circuit board (PCB) by bonding wire, solder bump, or other conventional conductive structures thereby a device on the base chip 111 can electrically connect to an external circuit through the bonding pads 122.

The cover chip 211 can be a semiconductor material with higher resistiveness such as single crystal silicon, glass, ceramic, bismaleimide-triazine, or fiberglass reinforced epoxy resin. Preferably, the base chip 111 and the cover chip 211 are made of same material (i.e. silicon) so as to avoid the thermal expansion mismatch problem, and the subsequent processes of the wafer-level package, therefore, can be implemented by the same processing methods and conditions for general silicon wafers.

The semiconductor micro device 130 disposed on the base chip 111 can comprise any micro active devices such as integrated circuits, MEM devices, or moving parts, or any micro passive devices such as sensors, capacitors, resistors, or inductors. The semiconductor micro device 130 is electrically connected to the bonding pad 122 by channels (not shown) or wires (also not shown). However, those skilled in the art will appreciate that there is an insulating layer (passivation layer) between the wires and the bonding pad ring 120 such that a short circuit can be prevented. Also, since the package 400 has the hermetical cavity 160, a moving part of the semiconductor micro device 130 can be substantially moved within the hermetical cavity.

Referring now to FIG. 5 to FIG. 8, they illustrate a manufacturing method of a wafer-level package with gold bump according to the present invention. Hereinwith, like elements in different figures will be indicated with like reference number.

Figure 5:
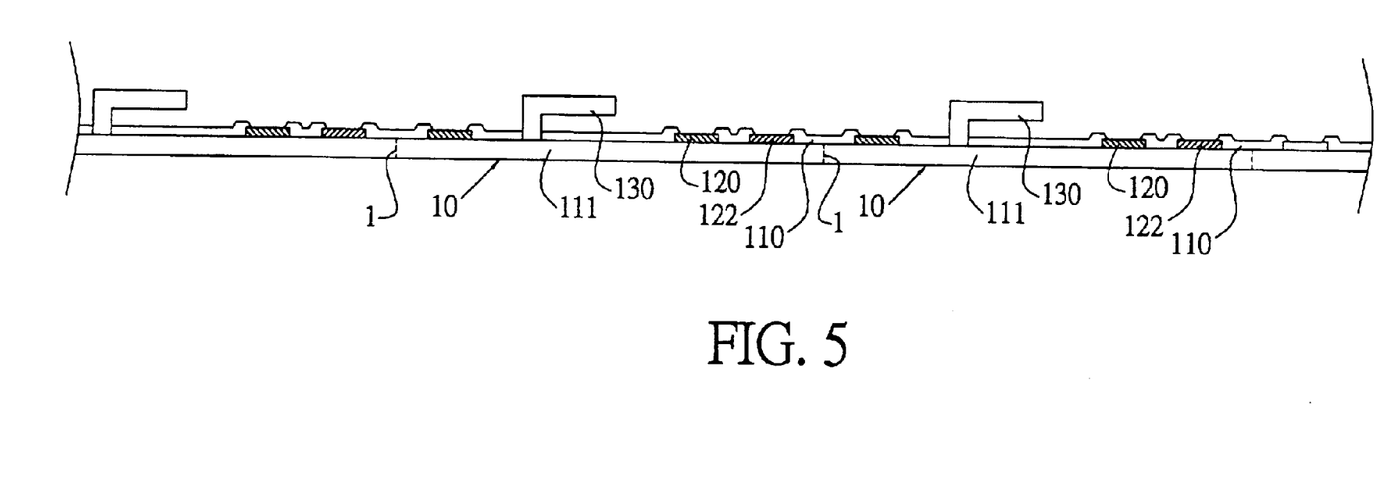
FIGS. 5–8 are schematic views for illustrating a manufacturing method of a wafer-level package with bump according to an embodiment of the present invention.
Figure 6A:
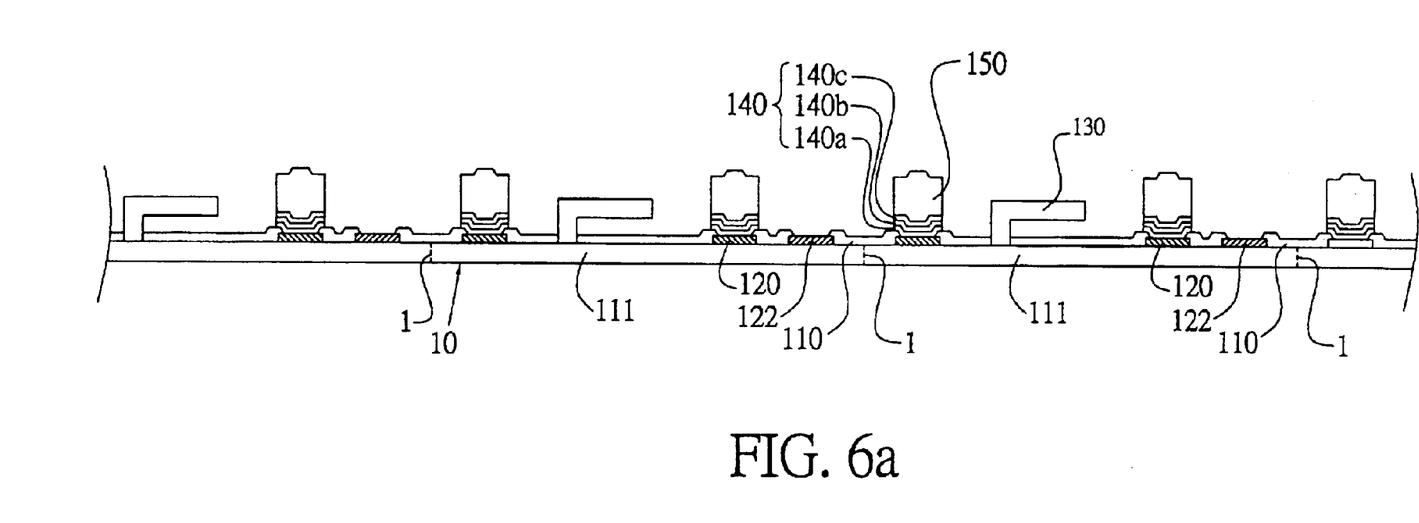
Figure 6B:
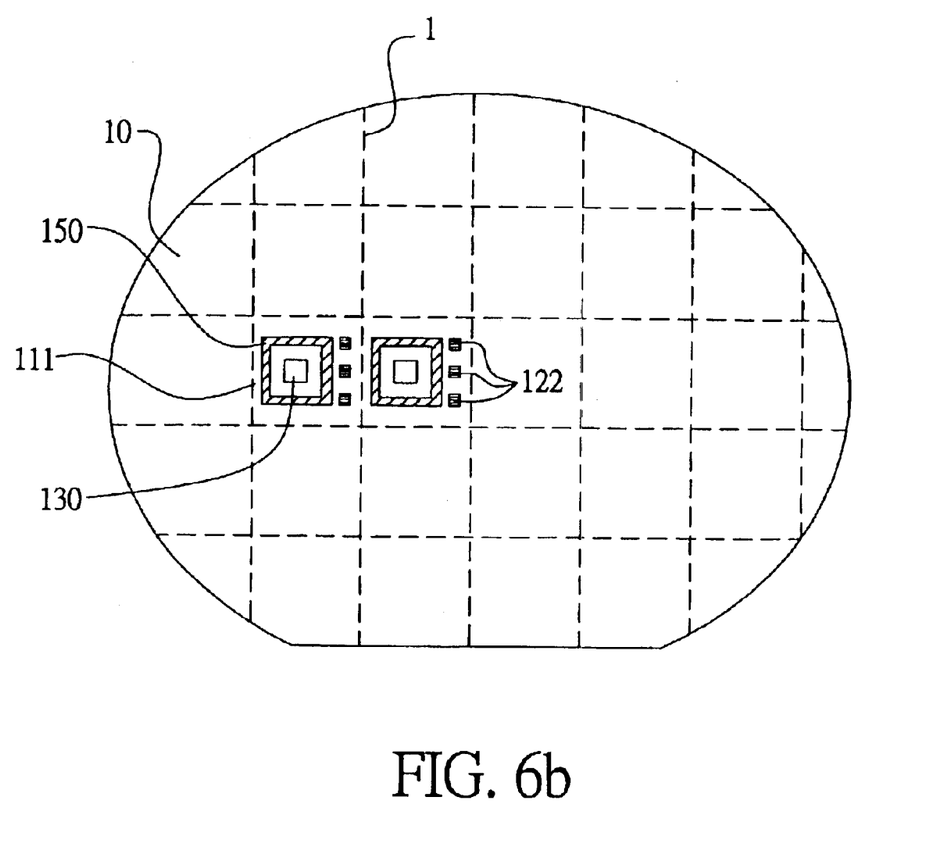

As shown in FIG. 5, a base wafer 10 comprises a plurality of base chips 111 spaced to one another by scribe lines 1, shown as dotted lines in FIG. 5, and the scribe lines 1 are generally located on the upper surface of the base wafer 10 as shown in FIG. 6b. A bonding pad ring 120 is disposed on the base wafer 10, and a plurality of bonding pads 122 are disposed outside the bonding pad ring 120.

The processing steps of the bonding pad ring 120 and the plurality of bonding pads 122 are as follows: depositing an adhesion layer (not shown) on the base wafer 10; depositing a conductive-material layer on the adhesion layer by sputtering or evaporation; transferring patterns by a photolithography process; and etching undesired portions of the conductive-material layer. Alternatively, the processing steps can be also as follows: depositing an adhesion layer and a conductive material by a photolithography process;

and stripping the photoresist so as to form the bonding pad ring 120 and bonding pads 122 on the base wafer 10. The material of the conventional bonding pads is aluminum.

Each base chip 111 has a bonding pad ring and a plurality of bonding pads 122, and the number of the bonding pads 122 depends on the number of the outputs and inputs of a designed circuit on each base chip 111. A passivation layer 110 formed by a dielectric layer covers the top edge portion of the bonding pad ring 120 and the top edge portion of the bonding pad 122 wherein the center portion of the bonding pad ring 120 and the center portion of the bonding pad 122 are exposed from the passivation layer 110. The passivation layer 110 can be formed of a polymide layer, a silica layer, a silicon nitride layer, or other well-known passivation material.

FIG. 6a shows a wafer bump process comprising a UBM process and a bump process wherein the UBM process can be found in U.S. patent application Ser. No. 09/928,694 (counterpart application of R.O.C patent application Ser. No. 90/109,841) commonly assigned to the present assignee, which is incorporated herein by reference. For example, the UBM 140 comprises an aluminum layer 140a, as an adhesion layer, formed on the bonding pad ring 120 at a portion exposed from the passivation layer 110; a nickel-vanadium layer 140b, as a barrier layer, formed on the aluminum layer 140a; and a gold layer 140c, as a wetting layer, formed on the nickel-vanadium layer 140b. According to the UBM 140 of the present invention, the aluminum layer 140a is selected as the adhesion layer since it provides a good adhesion to the bonding pad ring 120 and the passivation layer 110. The gold layer 140c is selected as the wetting layer since it provides a good bonding effect to the gold bump ring 150.

The UBM 140 described above may be formed by an additive process for selective depositing composite layer thereof onto the aluminum bonding pad ring 120. Additive processes are well known and include lift-off techniques, and the use of shadow masks.

Alternatively, the UBM 140 described above may be formed by a subtractive process. The process comprises the following steps: (a) Sputter depositing UBM layers 140 (including adhesion layer 140a, barrier layer 140b and wetting layer 140c) across the passivation layer 110 and the exposed surface portions of the aluminum bonding pad ring 120; (b) Applying photoresist and patterning; (c) Electrodepositing gold material on the resist opening section; and (d) Etching the UBM layers with the gold material as shadow mask. Then, the photoresist is stripped so as to form the gold bump ring 150, which generally comprises at least about 90 weight percentage of gold (Au), as shown in FIG. 6a.

FIG. 6b, a top plane view of FIG. 6a, shows a base wafer 10 comprising a plurality of base chips 111 wherein each base chip is spaced to one another by scribe lines 1 and is provided with a semiconductor micro device 130 thereon, a bump ring 150 disposed on a bonding pad ring (not shown), and a plurality of bonding pads 122.

Figure 7:
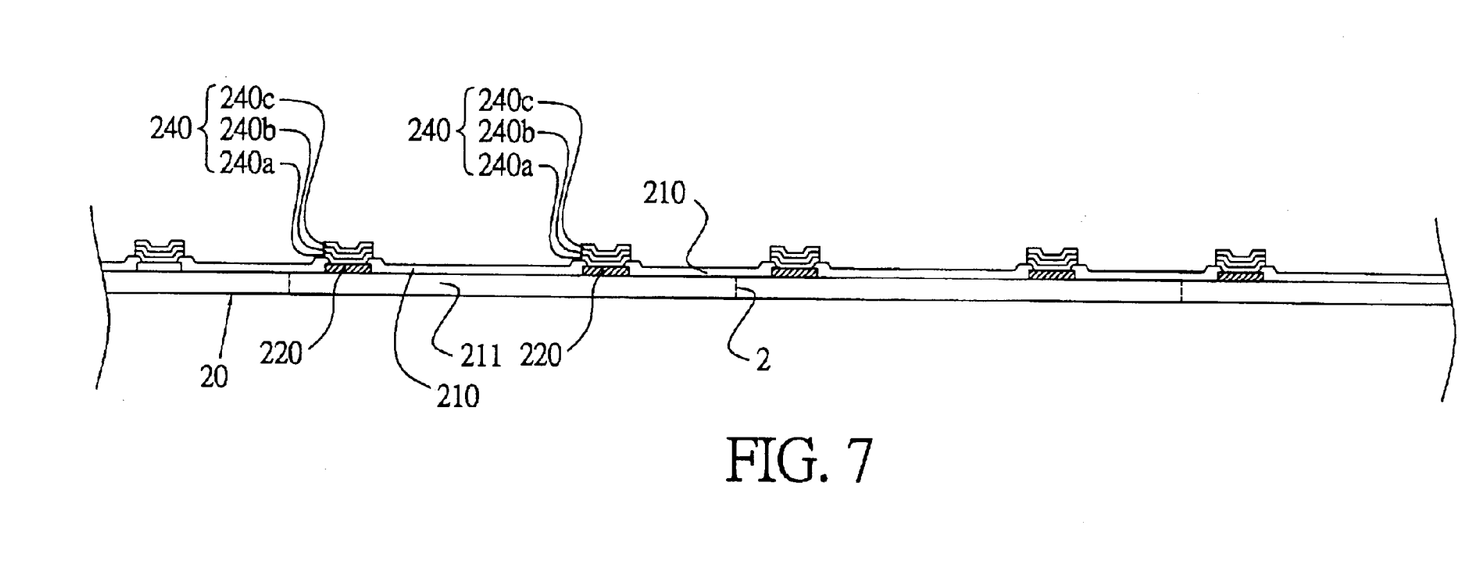

FIG. 7 discloses that a UBM 240 is formed on a bonding pad ring 220, at a portion exposed from a passivation layer 210, of a cover wafer 20 by a UBM process; and each UBM 240 comprises a adhesion layer 240a, a barrier layer 240b, and a wetting layer 240c.

Figure 8:
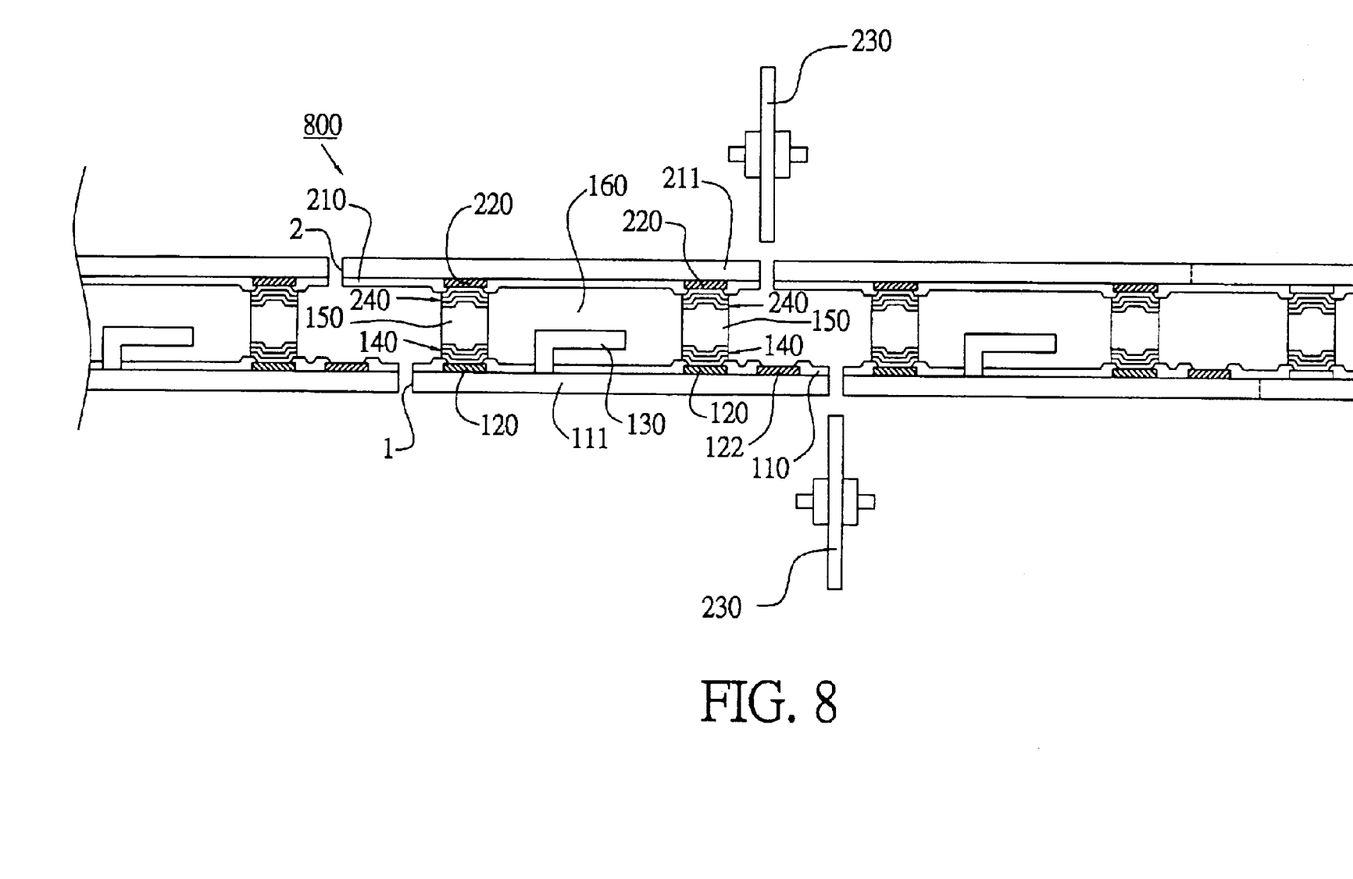

FIG. 8 shows a wafer-to-wafer bonding process in which the cover wafer 20 is aligned with the base wafer 10 such that the bonding pad ring 120 of the base chip 111 is aligned with the bonding pad ring 220 of the cover chip 211 and each scribe line 2 is substantially aligned with the bonding pads 122 of the base chip 111 as can be seen in FIG. 8, and then the base wafer 10 is bonded with the cover wafer 20 by a thermocompression bonding process or a thermosonic bonding process so as to form a bonding wafer 800.

The thermosonic bonding process comprises the following steps: positioning one of the base wafer 10 and the cover wafer 20 to a hot stage with temperature between 100° C. and 150° C.; aligning the other wafer with the wafer on the hot stage and applying a pressure on it so as to initiate a contact between these two wafers; inputting an ultrasonic wave with a frequency ranging from 20 to 60 kHz and with an amplitude ranging from 20 to 200 mm while the pressure reaching a certain level, thereby the cold welding effect is generated, by the vibration and the pressure of the ultrasonic wave, so as to complete the bonding process. The input ultrasonic wave can erase the oxidative layer and contamination on the bonding pad surface and combine the heat so as to improve the bonding between wafers. The bonding wafer 800 comprises a plurality of packages 400.

Finally, the thermosonic bonding process further comprises the step: cutting the bonding wafer 800 along the scribe lines 1 and the scribe lines 2 by a cutter 230 so as to form the packages 400 individually. During the cutting process, the cutter 230 cuts a partial thickness of the scribe lines 1 and the scribe lines 2, and then the packages 400 are split individually by a mechanical process thereby the packages 400 of the bonding wafer 800 can be prevented from being damaged by extremely cutting of the cutter 230.

According to the method for manufacturing package of the present invention, the base 10 wafer and the cover wafer 20 can be bonded by employing the bump in vacuum with a low temperature (below 150° C.), namely cold welding process, such that the method is applicable for a packaging process having various type of semiconductor micro devices. Those skilled in the art will appreciate that the gold bump of the present invention can be easily replaced by solder bump. A metal (gold or solder) with hardness, instead of the conventional outgasing material (i.e. epoxy), can be used as an intermediated layer between these two wafers for forming a hermetical cavity between these two wafers, so as to ensure the reliability of the semiconductor micro device.

While the foregoing description and drawings represent the embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components. The presently disclosed embodiments are therefore to be considered in all respects as illustrative and not restrictive, the scope of the invention being indicated by the appended claims and their legal equivalents, and not limited to the foregoing description.

What is claimed is:

1. In combination, a first substrate comprising a plurality of first chips spaced one from another by first scribe lines, wherein each of said first chips has a semiconductor micro device, a bonding pad ring surrounding the semiconductor micro device, a plurality of bonding pads disposed outside the bonding pad ring and electrically connected to the semiconductor micro device for electrically connecting the semiconductor micro device to an external circuit;

a second substrate comprising a plurality of second chips spaced one from another by second scribe lines, wherein each of said second chips has a bonding pad ring corresponding to the bonding pad ring of the first chips; and a plurality of bump rings each bump ring respectively being disposed between the bonding pad ring of one of the first chips and the bonding pad ring of one of the second chips for bonding the first and the second chips, so as to form a hermetical cavity;

wherein each second scribe line is substantially aligned with the bonding pads of one of the first chips; and wherein the first and second scribe lines are configured for the first substrate and the second substrate to be cut respectively so as to form a plurality of individual packages.

2. The combination according to claim 1, wherein each first chip has a passivation layer covering a top edge portion of the bonding pad ring and a top edge portion of each bonding pad wherein a top center portion of the bonding pad ring and a top center portion of each bonding pad are exposed through the passivation layer.

3. The combination according to claim 1, wherein the bonding pad rings of the first substrate and the second substrate are aluminum bonding pad rings.

4. The combination according to claim 1, wherein the respective bonding pad rings of each first chip and each second chip further comprise an under bump metallurgy (UBM) comprising an adhesion layer, a barrier layer, and a wetting layer.

5. The combination according to claim 1, wherein each second chip has a passivation layer covering a top edge portion of the bonding pad ring wherein a top center portion of the bonding pad ring is exposed through the passivation layer.

6. The combination according to claim 1, wherein the first substrate and the second substrate are selected from the group consisting of organic substrate, bismaleimide-triazine substrate, and glass substrate.

7. The combination according to claim 1, wherein the material of the first substrate and the second substrate is single crystal silicon.

8. The combination according to claim 1, wherein the semiconductor micro device is selected from the group consisting of integrated circuit, micro-electro mechanical system (MEMs) component, moving part, and sensor.

9. The combination according to claim 1, wherein the bump ring is a gold bump ring.

10. The combination according to claim 1, wherein the bump ring is a solder bump ring.

11. A wafer-level package, comprising:
a first chip having, on an upper surface thereof, a semiconductor micro device, a first bonding pad ring surrounding the semiconductor micro device, and a plurality of bonding pads disposed outside the first bonding pad ring and electrically connected to the semiconductor micro device for electrically connecting the semiconductor micro device to an external circuit;

a second chip disposed above said first chip and having a lower surface facing the upper surface of said first chip, said second chip having on said lower surface a second bonding pad ring corresponding to the first bonding pad ring of the first chip; and a bump ring disposed between the first and second bonding pad rings for bonding the first and the second chips so as to form a hermetical cavity;

wherein said second chip has a first side surface located above the bonding pads of the first chip, and a plane of said first side surface extends through the bonding pads of the first chip.

12. The wafer-level package according to claim 11, wherein the bonding pads of said first chip are all disposed to one side of said first bonding pad ring.

13. The wafer-level package according to claim 12, wherein said second chip further has a second, opposite side surface, and a plane of said second side surface does not extend through said first chip.

14. The wafer-level package according to claim 13, wherein the planes of said first and second side surfaces are parallel and perpendicular to a plane of the upper surface of said first chip.

15. A wafer-level package, comprising:
a first chip having, on an upper surface thereof, a first semiconductor micro device, a first bonding pad ring surrounding the first semiconductor micro device, and a plurality of first bonding pads disposed outside the first bonding pad ring and electrically connected to the first semiconductor micro device;

a second chip disposed above said first chip and having a lower surface facing the upper surface of said first chip, said second chip having on said lower surface a second bonding pad ring corresponding to the first bonding pad ring of the first chip; and a first bump ring disposed between the first and second bonding pad rings for bonding the first and the second chips so as to form a first hermetical cavity;

said package further comprising:
a third chip having, on an upper surface thereof, a second semiconductor micro device, a third bonding pad ring surrounding the second semiconductor micro device, and a plurality of second bonding pads disposed outside the third bonding pad ring and electrically connected to the second semiconductor micro device;

a fourth chip disposed above said third chip and having a lower surface facing the upper surface of said third chip, said fourth chip having on the lower surface thereof a fourth bonding pad ring corresponding to the third bonding pad ring of the third chip; and a second bump ring disposed between the third and fourth bonding pad rings for bonding the third and the fourth chips so as to form a second hermetical cavity;

wherein
the first and third chips are adjacent to each other and formed in a lower substrate having at least a first scribe line between said first and third chips which are to be separated from each other when said lower substrate is cut along said first scribe line;

the second and fourth chips are adjacent to each other and formed in an upper substrate having at least a second scribe line between said second and fourth chips which are to be separated from each other when said upper substrate is cut along said second scribe line; and a plane, which contains the second scribe line and is perpendicular to a plane of the upper surface of said third chip, extends through the second bonding pads of said third chip.

16. The wafer-level package according to claim 15, wherein
said lower substrate further comprises a fifth chip having, on an upper surface thereof, a third semiconductor micro device, a fifth bonding pad ring surrounding the third semiconductor micro device, and a plurality of third bonding pads disposed outside the fifth bonding pad ring and electrically connected to the third semiconductor micro device;

said upper substrate further comprises a sixth chip disposed above said fifth chip and having a lower surface facing the upper surface of said fifth chip, said sixth chip having on the lower surface thereof a sixth bonding pad ring corresponding to the fifth bonding pad ring of the fifth chip;

said package further comprises a third bump ring disposed between the fifth and sixth bonding pad rings for bonding the fifth and the sixth chips so as to form a third hermetical cavity;

the first and fifth chips are adjacent to each other, the third and fifth chips are disposed on opposite sides of said first chip, and said lower substrate further comprises at least a third scribe line between said first and fifth chips which are to be separated from each other when said lower substrate is cut along said third scribe line;

the second and sixth chips are adjacent to each other, the fourth and sixth chips are disposed on opposite sides of said second chip, and said upper substrate further comprises at least a fourth scribe line between said second and sixth chips which are to be separated from each other when said upper substrate is cut along said fourth scribe line; and a plane, which contains the fourth scribe line and is perpendicular to a plane of the upper surface of said first chip, extends through the first bonding pads of said first chip.

* * * * *